United States Patent [19]

Butler et al.

[11] 4,443,731

[45] Apr. 17, 1984

[54] HYBRID PIEZOELECTRIC AND MAGNETOSTRICTIVE ACOUSTIC WAVE TRANSDUCER

[76] Inventors: John L. Butler, 205 Carolyn Cir., Marshfield, Mass. 02050; Arthur Clark, 10421 Floral Dr., Adelphi, Md. 20783

[21] Appl. No.: 430,776

[22] Filed: Sep. 30, 1982

[51] Int. Cl.3 .............................. H01L 41/08

[52] U.S. Cl. .............................. 310/334; 310/26; 310/328; 310/337

[58] Field of Search .............. 310/321, 322, 328, 337, 310/330–332, 26, 334

[56] References Cited

U.S. PATENT DOCUMENTS

| | | | |
|---|---|---|---|
| 2,101,272 | 12/1937 | Scott | 310/328 X |
| 2,405,604 | 8/1946 | Pope | 310/337 X |
| 2,551,848 | 5/1951 | Parker | 310/318 X |
| 2,636,135 | 4/1953 | Peek, Jr. | 310/328 |
| 2,683,856 | 7/1954 | Kornei | 310/328 X |
| 2,834,943 | 5/1958 | Grisdale et al. | 310/328 X |
| 2,945,192 | 7/1960 | Szymanski | 310/328 X |
| 3,148,289 | 9/1964 | Pijls | 310/328 |
| 3,261,339 | 7/1966 | Quinn | 310/317 X |
| 3,484,630 | 12/1969 | Schwartz | 310/26 |

*Primary Examiner*—Mark O. Budd
*Attorney, Agent, or Firm*—Wolf, Greenfield & Sacks

[57] ABSTRACT

The transducer is one that combines magnetostrictive and electrostrictive/piezoelectric transducer effects to form a transducer with improved performance. A transducer is provided which the two aforementioned effects are mechanically coupled in series allowing cancellation of the motion at one end of the transducer and maximization of the motion at the other end thereof. In an alternate construction, respective transducer types are connected mechanically in parallel in which the pressure may be cancelled on one side and increased on the other side of the transducer array. Either the velocity of pressure cancellation leads to a transducer element or transducer array with unidirectional properties. This device described herein may also be used as an intensity measuring instrument or as an acoustic sound repeater. Moreover, because the magnetostrictive part of the transducer is inductive and the piezoelectric part is capacitive, they may be used together to electrically tune each other and thus not require additional electrical elements.

16 Claims, 8 Drawing Figures

Fig. 1
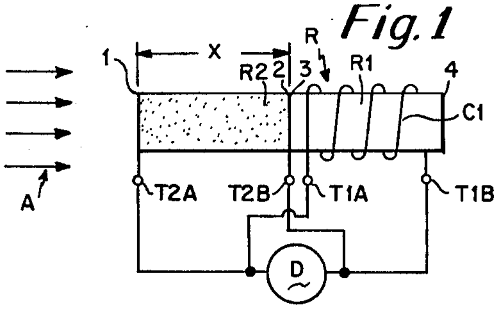
Fig. 2
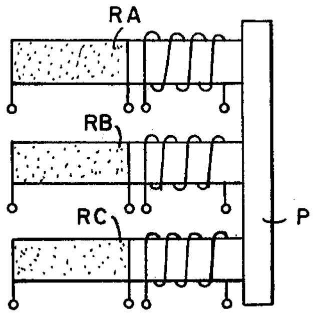
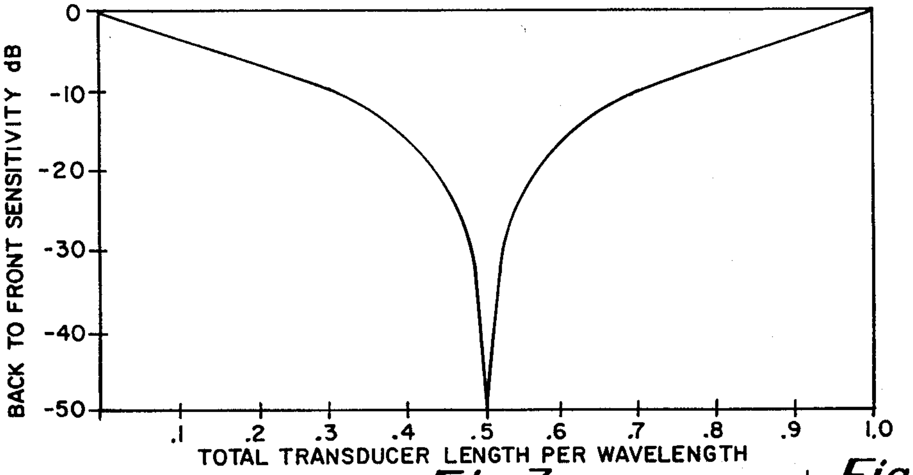
Fig. 3
Fig. 4
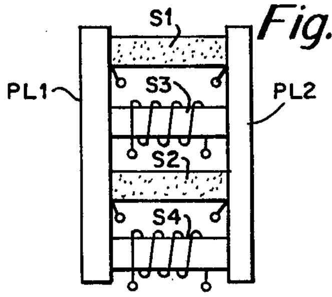
Fig. 5
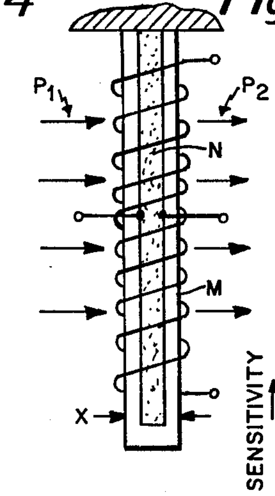
Fig. 6A
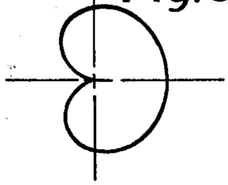
Fig. 6B
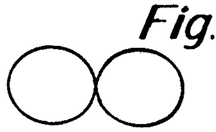
Fig. 7
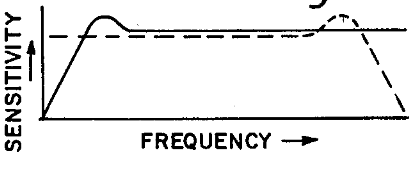

HYBRID PIEZOELECTRIC AND MAGNETOSTRICTIVE ACOUSTIC WAVE TRANSDUCER

BACKGROUND AND SUMMARY OF THE INVENTION

The present invention relates very generally to transducers and pertains, more particularly, to a unitary piezoelectric-magnostrictive transducer in which magnetostrictive and electrostrictive/piezoelectric transducer effects are combined together to form an improved transducer design.

Either electrostrictive (piezoelectric) transducers or magnetostrictive transducers have been used in the past as the transduction means for generating or receiving sound in underwater acoustic systems. However, although these different types of transducers have been used separately, the art does not teach the combination of active electrostrictive and magnetostrictive transducer materials intimately combined in a unitary transducer construction. It is the concepts of the present invention that teach the embodying of the transducer in this unitary construction. Such a combination of transducer effects is used to attain special directional patterns such as in the form of a cardioid. Also, this arrangement allows the possibility of using one transducer to electrically tune the other.

In the past the piezoelectric ceramics, such as lead zirconate titanate were nearly twice as active as the magnetostrictive materials. However, there is now an advent of newer rare earth iron magnetostrictive materials that are comparable to the piezoelectric ceramics and this has the effect of enhancing the transducer combination effects of the present invention.

In accordance with the present invention, rare earth iron magnetostrictive materials such as $Tb_3\,Dy_7\,Fe_2$ or the amorphous metalic glass magnetostrictive material such as $Fe_{81}\,B_{13.5}\,Si_{3.5}\,C_2$ may be used as the magnetostrictive portion of the transducer. This makes the activities of both transducer mechanisms much more compatible leading to better performance when both effects are combined as in accordance with this invention. In accordance with the invention, the two effects are combined mechanically so as to in essence form a single transducer thus greatly improving performance. Although the aforementioned active materials may be employed such as the new rare earth iron magnetostrictive materials, it is understood that the prior less active materials may also be used in accordance with the principles of this invention with only possibly somewhat reduced performance.

BRIEF DESCRIPTION OF THE DRAWINGS

Numerous other objects, features and advantages of the invention should now become apparent upon a reading of the following detailed description taken in conjunction with the accompanying drawing, in which:

FIG. 1 schematically illustrates a preferred form of the present invention in which piezoelectric and magnetostrictive elements are unitarily combined into a single transducer;

FIG. 2 shows a series of series connected transducers associated with a piston;

FIG. 3 is a graph associated with FIG. 1 and showing a plot of back to front sensitivity vs. transducer length per wavelength;

FIG. 4 shows an alternate construction of the present invention in which the transducers are connected in parallel;

FIG. 5 shows another embodiment of the present invention in the form of a mechanically, continuously parallel, construction;

FIGS. 6A and 6B show two different forms of beam patterns that are generated in association with the transducer of FIG. 5; and FIG. 7 is a plot associated with the embodiment of FIG. 5 of sensitivity vs. frequency.

DETAILED DESCRIPTION

The nature of the magnetostriction and electrostriction (piezoelectric) effects is such that each are electrically 90° out of phase with each other. The 90° phase change is traced to the voltage which is developed as a result of the change in the magnetic flux. This means that for sinusoidal motion of one, the other moves cosinusoidally, each being driven with the same electrical signal (of the same electrical phase). Likewise, on reception of an acoustical signal,, the two electrical outputs are 90° out-of-phase. This natural 90° phase difference in motion combined with a spatial distance in which an additional 90° phase shift is attained (through a distance of one quarter of one wavelength) affords summation in one direction and cancellation in the opposite direction leading to the means for a directional transducer.

FIG. 1 illustrates one embodiment of the present invention in the form of a transducer rod R having a magnetostriction rod section R1 and a piezoelectric rod section R2. The section R1 has associated therewith a coil C1 having associated terminals T1A and T1B. Similarly, the piezoelectric segment R2 has terminals T2A and T2B at the ends thereof as illustrated. In FIG. 1 the rod segment R2 has respective ends 1 and 2 while the rod segment R1 has respective ends 3 and 4. The ends of the different segments are used hereinafter in analysis of the transducer.

The magnetostrictive rod segment may be constructed of a highly active rare earth iron material. The piezoelectric rod segment may be a highly active lead zirconate titanate ceramic. Both of these segments are mechanically secured together as a single piece.

In the example illustrated in FIG. 1, the rod R has a length of one half wavelength and each segment is one quarter wavelength long. Since the two different segments may not have the same sound speed, both lengths may not necessarily be the same structural length.

In FIG. 1 the transducer is illustrated as being a receiver. However, it is understood that the device may also be used as a transmitter. As a receiver it is noted that there is also provided a detector D. The terminals T1A and T2A connect in parallel to one side of the detector while the terminals T1B and T2B connect in parallel to the other side of the detector. In essence, the two rod segments are connected in parallel to the detector.

In the analysis to now be described, it can be assumed that a plane wave impinges on the left end of the rod R illustrated in FIG. 1. In FIG. 1 the sound wave is illustrated by the series of arrows A. In order to simplify matters, it is considered that the material is of the same characteristic impedance in each segment and there is thus no reflection at the junction. Assuming this junction between the materials is to be a phase reference point, the sound at point one is advanced by the phase $\theta$ referenced to the point two corresponding to the travel distance X. Here, $\theta = 2\pi x/\lambda$ where $\lambda$ is the wavelength in the material. Now, the sound travels through the magnetostrictive rod segment thereafter. Because of the magnetostriction effect, there is an additional phase shift of 90° ($\pi/2$) at point or position three, and then an additional phase delay of 90° at the end point or position four.

Thus, the total normalized output voltage detected at the terminals illustrated in FIG. 1 from both transducer segments may be expressed by the following equation:

$$V = e^{i\theta} + 1 + e^{i\pi/2} + e^{i\pi/2 - i\theta}. \quad (1)$$

Equation (1) above may also be exposed as follows:

$$V = \sqrt{2}\, e^{i\pi/4} [1 + \sqrt{2} \sin (\theta + \pi/4)] \quad (2)$$

For a wave travelling in the opposite direction, the phase $\theta$is $-\theta$. One can thus compute the back to front ratio from the above formulii. The result is shown graphically in FIG. 3. As a function of the total phase length, $2\theta$, of the transducer. Thus, when the entire rod is one-half of one wavelength in length, there is no reception of sound from the opposite end. It is also seen that there is at least a 15 dB reduction for reception for the opposite end for the total transducer length ±20% of the wavelength length.

With the illustration of FIG. 1 and the associated diagram of FIG. 3, there is shown one relatively simple mathematical description in which there has been examined end motions of the rod segments. Actually, the analysis is in practice, somewhat more complex and may be examined in more detail by a wave solution with boundary values.

As indicated previously, in FIG. 1 the transducer is shown in a form as a receiver. The device may also be used as a transmitter in which case the detector D would be replaced by a source S. In this case, sound is emitted from point or position four of the transducer as if a wave had travelled through it from point one to point four. In this transmitting case, the end four is moving with the greatest motion while the end one is moving with little or no motion, particularly if the total transducer is one-half wavelength long. In this transmitting mode, it is desirable to electrically tune the transducer. In accordance with the present invention, this may be accomplished without the need for additional tuning elements by adjusting the capacity of the piezoelectric transducer and the inductance of the magnetostrictive transducer for reactive cancellation at the operating frequency.

In the transmit mode, the reduced motion at one end is often preferable for a transducer since there is then no need for acoustic isolation, or if the transducer is hard mounted, there is little vibration transmitted to the mounting system.

In FIG. 1 there is illustrated, one of the simplest forms of the present invention. However, many other arrangements are contemplated as falling within the scope of this invention. For example, a plurality of these rods R may be connected in an array such as illustrated in FIG. 2. In FIG. 2 there are shown rods RA, RB, and RC. Each of these rods may be identical to the one illustrated in FIG. 1. The right hand end as illustrated in FIG. 2 couples directly to a piston P. In the case of the array, one side radiates the sound, while the other side receives the sound. In this sense, the transducer may be used as an acoustic repeater, receiving a small signal, electrically reamplifying it, and transmitting it in the same original direction. A large array may be used to attain a unidirectional narrow beam transducer, possibly one which needs no acoustic isolation on the rear side, and thus can operate under extremely high pressures. The transducer also may be a single element with a piston plate on the radiating or receiving end to improve the acoustic performance or may be used with other devices such as an inertial mass commonly recognized by those familiar with the art.

As indicated previously, FIG. 1 illustrates perhaps one of the simplest forms of the invention it being understood that other forms exist which also fall within the scope of this invention. For example, the material of the two bar segments may differ considerably. The piezoelectric bar may be made from a number of small bars cemented together and wired in parallel. This is referred to as the 33 mode. Alternatively, a quarter wavelength bar may be used with electrodes on the side. This is referred to as the 31 mode. FIG. 4 illustrates another arrangement in which the piezoelectric and magnetostrictive bar segments are mechanically connected at their ends so that the individual bar segments are now in parallel. In this case the sound propagates along the end plates PL1 and PL2. FIG. 4 illustrates the rod segments S1 and S2 which are of the piezoelectric type and segments S3 and S4 which are of the magnetostrictive type. With proper quarter wavelength spacing, the plates support a unidirectional flexural wave sending sound out along the surface in one direction. In the case of thicker end plates, unidirectional compressional waves and surface waves may also be generated. The device alternatively may be used with only one end plate.

FIG. 5 shows still another arrangement of the transducer of the present invention. This may be termed a mechanically, continuously parallel arrangment in which the transducer is of a flexural type; that is, one in which the bending of a plate or bar by an impinging sound wave produces a voltage output. FIG. 5 shows this flexural transducer including a piezoelectric ribbon M which is centrally disposed of a magnetostrictive ribbon M surrounding a piezoelectric strip N. The transducer illustrated in FIG. 5 is shown supported at one end which is the top end illustrated in FIG. 5. Alternatively, the device may be supported at both ends or in the center and may be used either as a transmitter or receiver of sound. This flexural construction provides a low resonant frequency and high sensitivity because of the high compliance of such an arrangement. For useful output in the bending mode, the transduction element on one side operates an opposite phase (for example, by simply reversing the wires) to the other side because on bending, one side stretches while the other side shrinks. In the central section, there is little difference and thus there need be no active material. In one design, the central inactive section may be as large as one-third the total thickness with the active element sandwiching this material, each active element being one-third the thickness.

In FIG. 5 as indicated previously, there is shown an active piezoelectric element N as the center section sandwiched between two magnetostrictive elements M. This center piezoelectric section may be constructed of lead zirconate titanate or piezoelectric polymer PVDF. The outer section M is preferably of metallic glass magnetostrictive material. FIG. 5 illustrates the wiring to the flexural transducer. The material may be wired oppositely on each side to attain the out of phase output required. Recognition of the direction of the magnetic biasing field is preferred for proper addition of the output.

In accordance with the embodiment of the invention in FIG. 5, the piezoelectric central element is not reverse wired for operation under bending motion and therefore, is insensitive to bending. However, it is sensitive to compressional force and thus the magnetostrictive section is sensitive to the bending of a pressure differential field while the piezoelectric material is sensitive to compressional pressure on the material. The former is sensitive to the gradient of the pressure and the latter is sensitive to the pressure itself. The product of these two terms is proportional to the intensity. In FIG. 5 the pressure P2 is slightly different from the pressure P1 due to the wave traversing the thickness $\Delta x$.

It is known that for a small size compared to the wavelength, the pressure sensitive devices are omnidirectional while the gradient sensitive devices are bidirectional with their being a beam pattern in the form of a cosine function of the angle measured in the direction of the vibration. In accordance with the present invention, there is provided a device that is simultaneously sensitive to both types without sacrificing the performance of either. Also, in accordance with the invention, the simultaneous detection is at the same location in the acoustic field allowing an acoustic measurement of the field. Since the velocity is proportional to the gradient, the product of the pressure and gradient is proportional to the intensity.

With reference to FIG. 5, in operation, the piezoelectric material is operated below its length or thickness resonance and is operated in either its 33 or 31 or hydrostatic mode. The magnetostrictive material is operated above its bending resonance. These two frequencies set the limits on the most useful bandwidth. When the two outputs are added together, a directional pattern in the form of a cardioid is attained. FIG. 6A shows the cardioid beam pattern while FIG. 6B shows a bi-directional beam pattern. FIG. 7 shows the graph of frequency vs. intensity for the device of FIG. 5.

Thus, a small unidirectional receiver (or transmitter) may be obtained in one mechanically vibrating unit. This unit may also be self-tuned. On transmission, the acoustic pressure adds in one direction and cancels in the other direction. Although there is no quarter wavelength spacial distance, there is the phase shift due to the bending beam operating above resonance in the mass controlled region. This, combined with the pressure gradient input, allows the cardioid pattern when summed with the piezoelectric element.

The present invention also affords an additional sound processing technique as an intensity measuring device. With the two outputs FIG. 5 multiplied together, rather than added, the output is proportional to the sound intensity rather than the pressure of velocity alone. The product has the directional properties of a cosine function of the angle. The direction of the intensity in this case is indicated by a positive or negative sign of the product. Both the omni-directional and bidirectional elements may be added to yield a cardioid pattern.

In summary, in accordance with the present invention, there is provided a transducer that provides for a combination of a magnetostrictive effect and piezoelectric effect into a single transducer. The special directional properties have been described in connection with the limited number of embodiments referred to hereinbefore. These different devices detect sound waves in a unidirectional way. They match the wave nature of a plane wave more closely in the sense that use is made simultaneously of both velocity and pressure information of the wave as opposed to only one or the other.

Having described a limited number of embodiments of the present invention, those skilled in the art will recognize variations in the illustrative designs that have been presented, such as mass load or use of a piston or horn coupling to the medium. These variations fall within the scope of the present invention in that they employ both magnetostrictive and piezoelectric materials combined together to form one transducer element. The concepts of the invention may be used in solids, liquids, and gases and as either a receiver or as a transmitter. Although newer materials permit improved performance, the devices that have been described may be constructed with conventional active materials. However, the use of newer, particularly magnetostrictive materials, allows significant improvement.

What is claimed is:

1. A transducer including means for transducing between acoustical energy and electrical energy and comprising; a first element having magnetostrictive properties and associated wiring, a second element having piezoelectric properties and associated wiring mechanical means for combining both said elements into a unitary transducer device, and electrical conductive intercoupling wiring means including conductive wire means for intercoupling wiring of the two elements for receiving or transmitting acoustical energy in a unidirectional manner for simultaneous excitation or detection of an acoustic wave, said transducer unidirectionality being established by cancellation of the motion at one end or the pressure on one end of the transducer.

2. A transducer as set forth in claim 1 wherein said unitary transducer device comprises a rod having integral rod segments of respective magnetostrictive and piezoelectric material.

3. A transducer as set forth in claim 2 wherein each said rod segment has an electrical length of one quarter wavelength.

4. A transducer as set forth in claim 2 wherein said magnetostrictive material comprises $Tb_{0.3}\,Dy_{0.7}\,Fe_2$.

5. A transducer as set forth in claim 2 wherein said magnetostrictive material comprises amorphous metallic glass such as $Fe_{81}\,B_{13.5}\,Si_{3.5}\,C_2$.

6. A transducer as set forth in claim 2 wherein said piezoelectric material comprises lead zirconate titanate.

7. A transducer as set forth in claim 2 wherein said transducer has a carioid directional beam pattern.

8. A transducer as set forth in claim 1 wherein the unidirectional manner of operation is substantially in accordance with the following expression relating voltage to the direction of the acoustic wave:

$$V=\sqrt{2}\,e^{i\pi/4}\,[1+\sqrt{2}\,\sin\,(\theta+\pi/4)].$$

9. A transudcer as set forth in claim 1 including means for combining the respective sensed outputs from the first and second elements.

10. A transducer as set forth in claim 9 wherein said outputs are combined to measure the intensity and direction of sound waves by forming the product of the outputs.

11. A transducer as set forth in claim 1 wherein said transducer device is operated as an acoustic repeater.

12. A transducer as set forth in claim 1 wherein said first and second elements are coupled in series.

13. A transducer as set forth in claim 1 wherein said first and second elements are connected in parallel mechanically.

14. A transducer as set forth in claim 1 wherein said first and second elements are stacked mechanically in parallel.

15. A transducer as set forth in claim 1 in which the magnetostrictive element detects bending motion and the piezoelectric element detects compression.

16. A transducer as set forth in claim 1 in which the transducer device is self-tuning by virtue of the inherent electrical capacity and inductance of the transducer device.

* * * * *